United States Patent

Rushmer et al.

(10) Patent No.: US 9,285,437 B2
(45) Date of Patent: Mar. 15, 2016

(54) HALL EFFECT SENSOR CORE WITH MULTIPLE AIR GAPS

(71) Applicants: Robert G Rushmer, Wauwatosa, WI (US); Jeffrey Annis, Waukesha, WI (US); Richard D Marasch, Germantown, WI (US); Greg Voborsky, Oak Creek, WI (US)

(72) Inventors: Robert G Rushmer, Wauwatosa, WI (US); Jeffrey Annis, Waukesha, WI (US); Richard D Marasch, Germantown, WI (US); Greg Voborsky, Oak Creek, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 33 days.

(21) Appl. No.: 14/044,402

(22) Filed: Oct. 2, 2013

(65) Prior Publication Data

US 2015/0091557 A1   Apr. 2, 2015

(51) Int. Cl.
*G01R 33/07* (2006.01)
*G01R 15/20* (2006.01)

(52) U.S. Cl.
CPC .............. *G01R 33/072* (2013.01); *G01R 15/20* (2013.01)

(58) Field of Classification Search
CPC ........................................ G01R 33/07
USPC ....................................... 324/251
See application file for complete search history.

(56) References Cited

U.S. PATENT DOCUMENTS

| | | | |
|---|---|---|---|
| 3,323,056 A | 5/1967 | Haley | |
| 3,340,468 A * | 9/1967 | Chu | 324/228 |
| 5,241,263 A | 8/1993 | Naoi | |
| 6,686,730 B2 | 2/2004 | Marasch et al. | |
| 6,759,840 B2 | 7/2004 | Marasch et al. | |
| 8,015,871 B2 * | 9/2011 | Sohn et al. | 73/313 |
| 2003/0227285 A1 | 12/2003 | Marasch | |
| 2006/0043960 A1 | 3/2006 | Itoh | |

FOREIGN PATENT DOCUMENTS

| | | |
|---|---|---|
| DE | 4229065 A1 | 3/1994 |
| GB | 825137 A | 12/1959 |
| WO | 9212432 A | 7/1992 |
| WO | 2013106957 A1 | 7/2013 |
| WO | 2013106958 A1 | 7/2013 |

OTHER PUBLICATIONS

Lastowiecki J: New Differential Compensative Current Measuring System Based on Amorphous Magnetic Circuit; Devices, Circuits and Systems, 1998; Proc of the 1998 2nd IEEE Int'l Caracas Conference on Isla de Margarits, Venezuela; Mar. 2-4, 1998, New York NY USA, IEEE US, Mar. 2, 1998; pp. 386-390.

European Search Report; Appln. No. 14187305.9-1560; Mar. 17, 2015; 10 Pages.

* cited by examiner

*Primary Examiner* — Bot Ledynh
(74) *Attorney, Agent, or Firm* — Quarles & Brady LLP

(57) ABSTRACT

A hall effect current sensor including a mounting bracket, a sensor assembly, and a sensor core. The sensor assembly includes a flux sensor. The sensor core includes a first portion and a second portion. The first portion and the second portion define a first air gap and a second air gap between the first portion and the second portion. The first air gap is adapted to receive the sensor assembly.

17 Claims, 9 Drawing Sheets

HALL EFFECT SENSOR CORE WITH MULTIPLE AIR GAPS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The subject matter disclosed herein relates generally to hall effect sensors, and, more particularly, to hall effect sensor cores including more than one air gap.

Hall effect current sensors are well known in the field of electronics. A hall effect current sensor is used to determine current passing through a current conductor. A typical hall effect current sensor allows a current conductor to pass through a central opening of a core. The core contains a single air gap where a circuit board is mounted. On the circuit board a hall effect device is mounted for measuring the flux density across the air gap in the core. The flux density across the air gap is linear and proportional to the current flowing through the conductor of a well-designed hall effect current sensor.

When the current passing through the conductor positioned in the central opening of the core surpasses a critical value, the flux density is at a peak and the core becomes saturated. The saturation of the core results in a non-linear output from the hall effect current sensor and reduced accuracy of the hall effect current sensor. Multiple methods can be employed to increase the peak flux density of a core. The size of the core and the gap in the core can be increased. Also, a step down transformer can be included in the device. These methods result in a larger device that is more expensive to manufacture and takes up more space.

It would, therefore, be desirable to have hall effect sensor cores that provide improved current sensing performance, but without the drawbacks associated with known hall effect sensor cores.

BRIEF DESCRIPTION OF THE INVENTION

The addition of a second air gap in a hall effect core reduces the magnetomotive force of the core. The reduction in magnetomotive force reduces the flux and flux density level across the first air gap. The reduced flux density prevents core saturation and allows for a linear output over higher current values. A hall effect core with more than one air gap can be a smaller, less expensive component of a device capable of sensing higher current values than a comparable single gap core.

According to one aspect of the invention, a hall effect current sensor includes a mounting bracket, a sensor assembly, and a sensor core. The sensor assembly further includes a flux sensor. The sensor core further includes a first portion and a second portion. The first portion and the second portion define a first air gap and a second air gap between the first and second portions. The first air gap is adapted to receive the sensor assembly.

According to another aspect of the invention, a core includes a first member, a second member, a first air gap, and a second air gap. The first member includes a first spine, a first arm, and a first leg. The second member includes a second spine, a second arm, and a second leg. The first air gap is defined by a first distance between the first arm and the second arm. The second air gap is defined by a second distance between the first leg and the second leg.

According to yet another aspect of the invention, a hall effect current sensor core includes a body. The body includes a plurality of air gaps. The body is configured to pass flux lines across each of the plurality of air gaps.

To the accomplishment of the foregoing and related ends, the embodiments, then, comprise the features hereinafter fully described. The following description and the annexed drawings set forth in detail certain illustrative aspects of the invention. However, these aspects are indicative of but a few of the various ways in which the principles of the invention can be employed. Other aspects, advantages and novel features of the invention will become apparent from the following detailed description of the invention when considered in conjunction with the drawings.

BRIEF DESCRIPTION OF THE DRAWINGS

The embodiments will hereafter be described with reference to the accompanying drawings, wherein like reference numerals denote like elements, and.

DETAILED DESCRIPTION OF THE INVENTION

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein.

The detailed description is to be read with reference to the figures. The figures depict selected embodiments and are not intended to limit the scope of embodiments of the invention.

Skilled artisans will recognize the examples provided herein have many useful alternatives and fall within the scope of embodiments of the invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings. As used herein, unless expressly stated otherwise, "connected" means that one element/feature is directly or indirectly connected to another element/feature, and not necessarily electrically or mechanically. Likewise, unless expressly stated otherwise, "coupled" means that one element/feature is directly or indirectly coupled to another element/feature, and not necessarily electrically or mechanically.

The various embodiments of the invention will be described in connection with a hall effect sensor core. That is because the features and advantages of the invention are well suited for this purpose. Still, it should be appreciated that the various aspects of the invention can be applied in other forms and in other electronic devices that utilize hall effect sensing.

Figure 1:
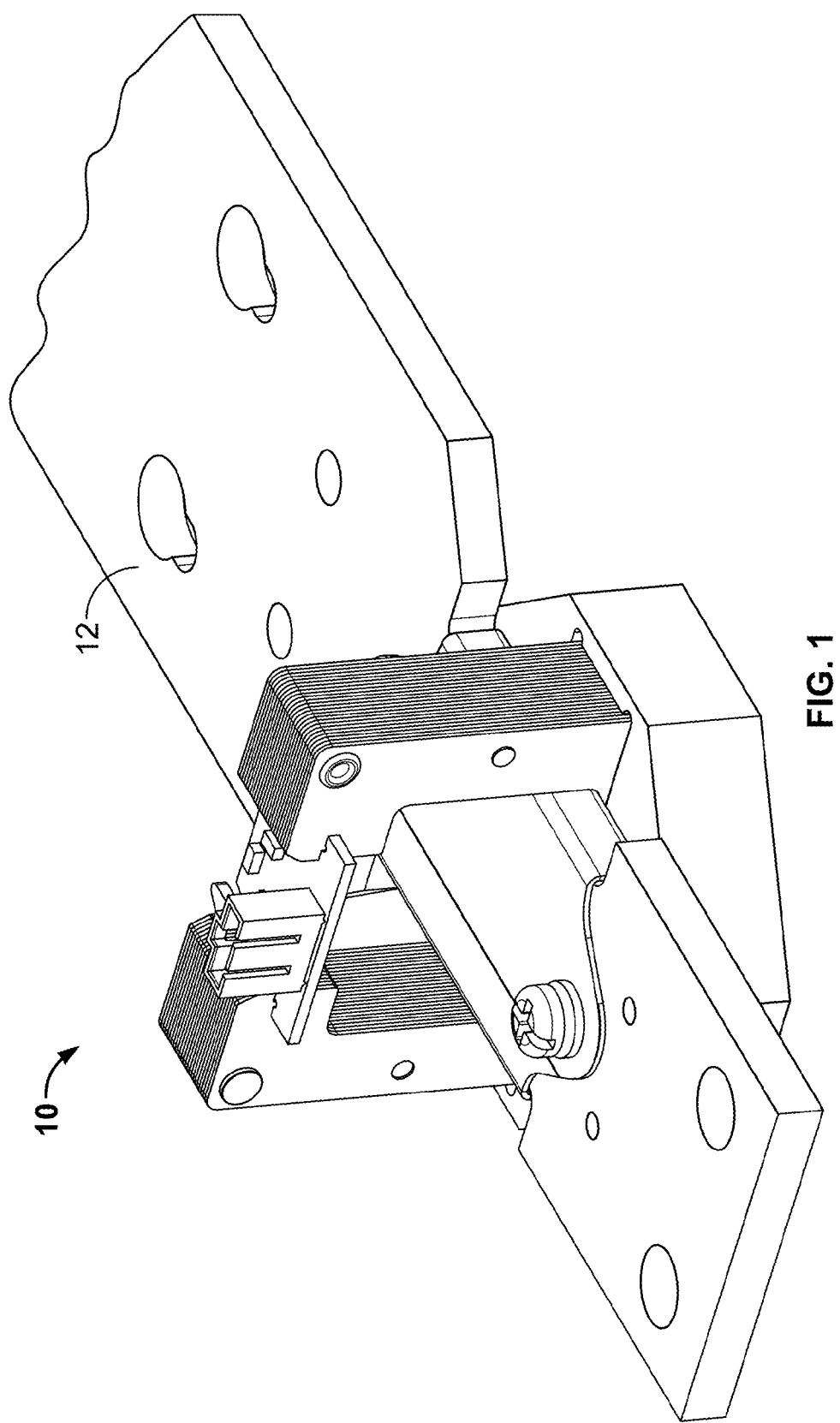
FIG. 1 is a perspective view of a hall effect current sensor with multiple air gaps assembled on a conductor.
Figure 2:
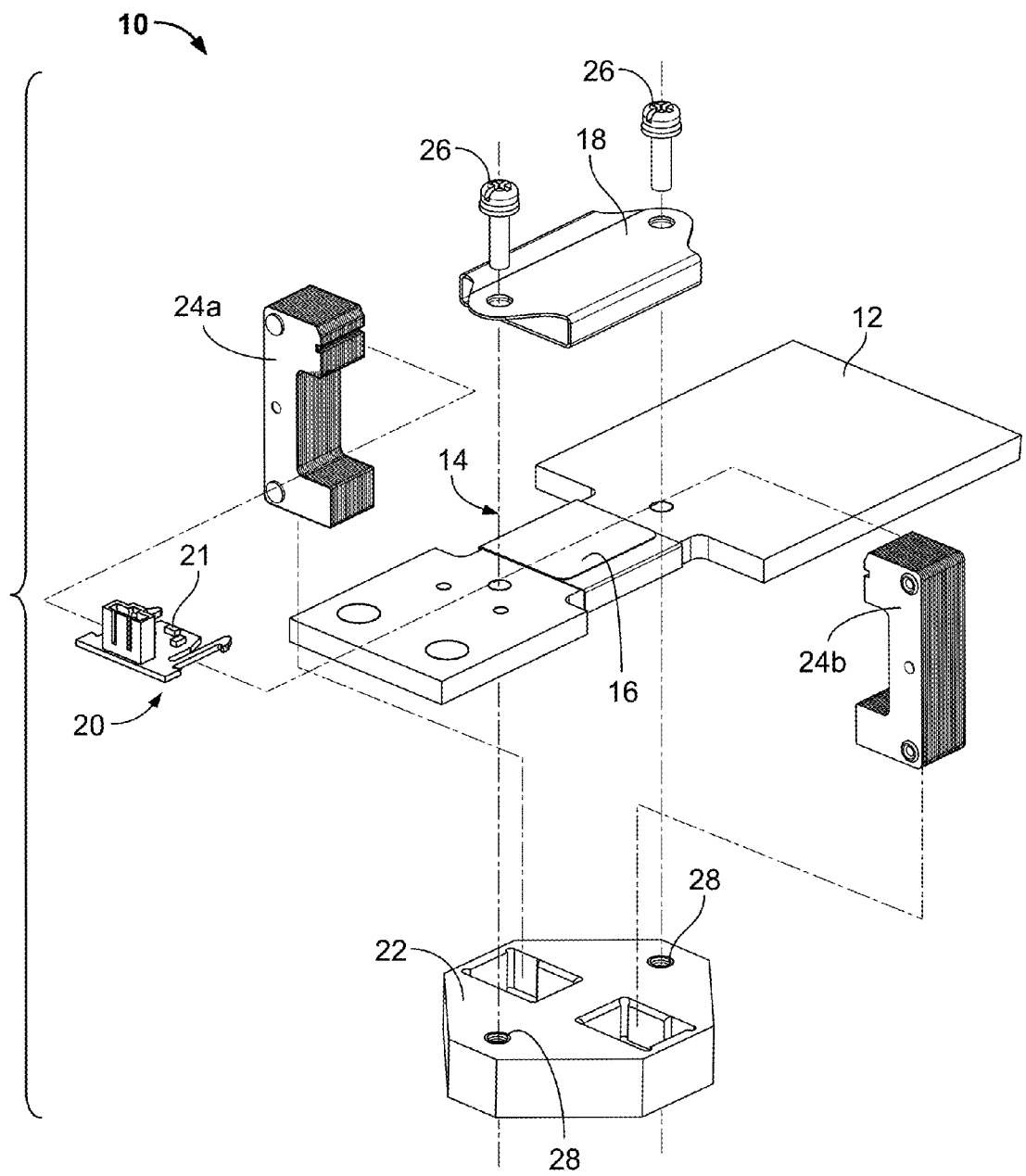
FIG. 2 is an exploded view of a hall effect current sensor with multiple air gaps around a conductor, as shown in FIG. 1.

Turning now to the drawings, and referring initially to FIGS. 1 & 2, a hall effect current sensor 10 with multiple air gaps can be mounted on an electrical conductor 12. The conductor 12 can be part of a larger device that is employing the current sensor 10. The current sensor 10 can be assembled around a narrowed portion 14 of the conductor 12. In the embodiment shown, the current sensor 10 further can include a sensor board assembly 20, a dialectric wrap 16 positioned around the narrowed portion 14, an insulator bracket 18, a sensor mount 22, and two permeable sensor core halves, a first portion 24a and a second portion 24b. Two screws 26 can pass through the insulator bracket 18 and into screw holes 28 in the sensor mount 22 to maintain the position of the current sensor 10 relative to the sensor mount 22.

Figure 3:
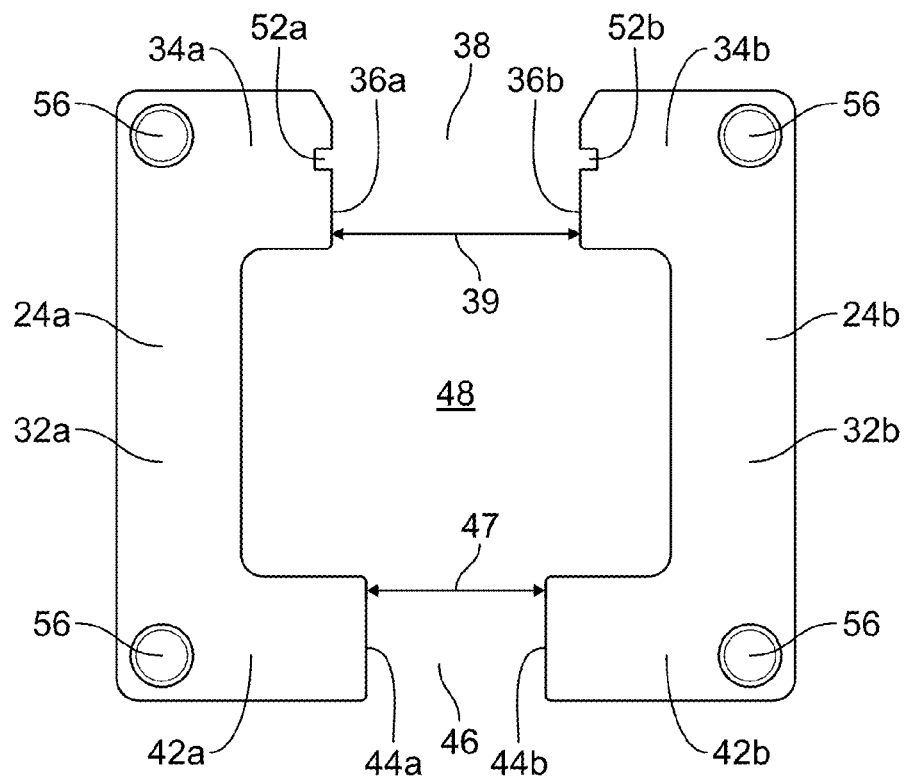
FIG. 3 is a front view of a hall effect sensor core including more than one air gap according to embodiments of the invention.
Figure 4:
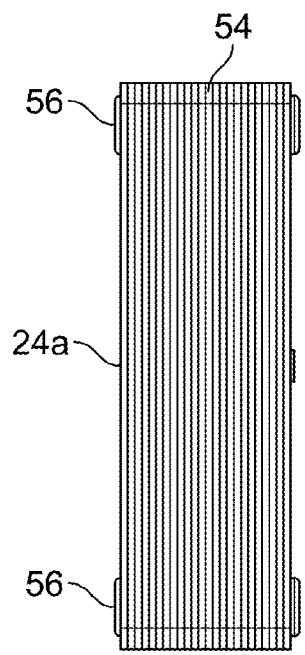
FIG. 4 is a side view of a hall effect sensor core including more than one air gap according to embodiments of the invention.

Referring to FIGS. 3 & 4, the two permeable sensor core halves 24a and 24b are shown in detail. The two sensor core halves 24a and 24b can be identical to each other and can form a sensor core when held in the proper orientation to each other by the sensor mount 22. Each sensor core half can include a spine, 32a and 32b respectively. From one end of the spines 32a and 32b, arms 34a and 34b can extend and terminate at distal ends 36a and 36b. The space between distal ends 36a and 36b can define a primary air gap 38 where flux lines pass between the distal ends 36a and 36b. From the opposite end of the spines 32a and 32b, legs 42a and 42b can extend and terminate at distal ends 44a and 44b. The space between distal ends 44a and 44b can define a secondary air gap 46 where flux lines pass between the distal ends 44a and 44b. The sensor core halves 24a and 24b can define a central opening 48 for a conductor to pass through.

The primary air gap 38 can be defined by a first length 39 of the space between distal ends 36a and 36b. The secondary air gap 46 can be defined by a second length 47 of the space between distal ends 44a and 44b. In some embodiments the first length 39 may be greater than the second length 47. In other embodiments, the second length 47 may be equal to or greater than the first length 39. The gap first length 39 and the gap second length 47 may be determined by one having ordinary skill in the art to produce different current measuring characteristics in a hall effect current sensor.

The primary air gap 38 can be the location for attaching the sensor board assembly 20 to the sensor core halves 24a and 24b. In the present embodiment, two notches, 52a and 52b can be located in the distal ends 36a and 36b. The purpose of the notches 52a and 52b can be to interact with the retaining structure (not shown) on the sensor board assembly 20. It can be imagined that there are methods know to one having ordinary skill in the art to attach the sensor board assembly 20 to the sensor core halves 24a and 24b of the present invention. One or more flux sensor 21 and additional electrical and electronic components (not shown) of the sensor board assembly 20 are well know and commercially available to one having ordinary skill in the art.

FIG. 4 shows a side view of sensor core half 24a. In some embodiments, each sensor core half can include a plurality of metallic laminations 54 to form the structure of the sensor core. The stack of metallic laminations 54 can be held together by rivets 56 passing through the ends of the spines 32a and 32b. Generally, hall effect sensor cores have an overall toroidal shape with a single air gap for placement of the sensor assembly. The number and shape of the laminations 54 of the present invention are easily modified by one with ordinary skill in the art to develop a sensor with the desired current range for a particular application. In some embodiments the sensor core halves 24a and 24b can be solid magnetic material pieces or a series of pieces held together by various means.

Figure 5:
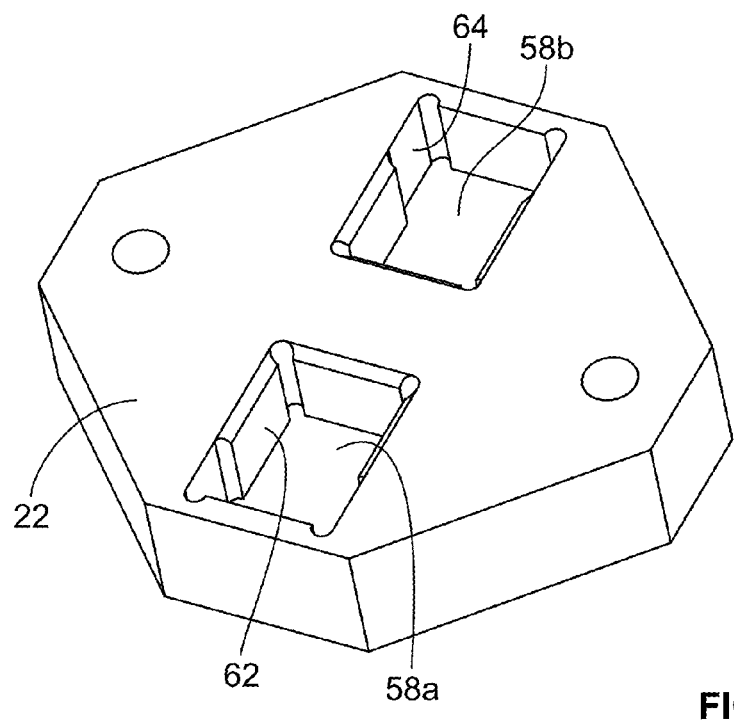
FIG. 5 is a perspective view of an embodiment of a sensor mount for a hall effect current sensor with multiple air gaps.

Referring to FIG. 5, an embodiment of the sensor mount 22 is shown. There can be two retaining spaces 58a and 58b located in the sensor mount 22. The retaining spaces 58a and 58b include sidewall projections 62 that can form a friction fit when sensor core halves 24a and 24b are inserted during assembly. The placement of the sidewall projections 62 can also create a notch 64 on each side of the retaining spaces 58a and 58b. The notch 64 can be for clearance of the rivets 56 that can extend slightly from the surface of the sensor core halves surface. The sensor mount 22 can allow the hall effect sensor 10 with multiple air gaps to be assembled around a conductor. The sensor mount 22 can retain the sensor core halves 24a and 24b in an orientation so as to maintain the first length 39 and the second length 47 of the primary and secondary air gaps, 38 and 46 respectively. There are many possible shapes and structures that could be used to position the sensor cores relative to each other. One having ordinary skill in the art could design a wide variety of mounting configurations to utilize a hall effect sensor 10 with multiple air gaps for a variety of applications.

Figure 6:
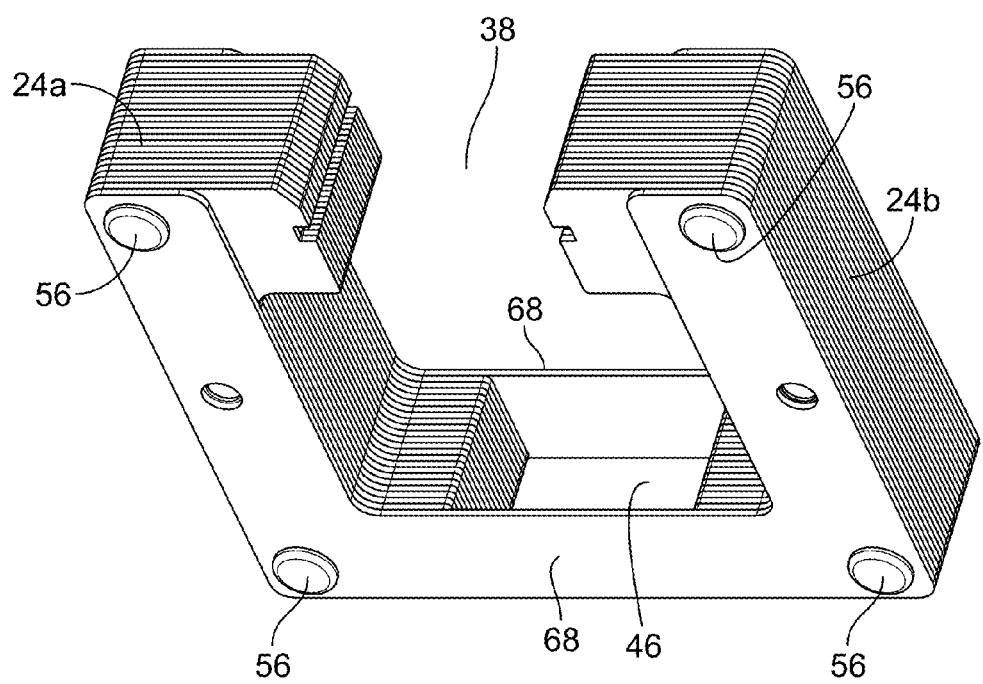
FIG. 6 is a perspective view of an alternative embodiment of a sensor mount for a hall effect current sensor with multiple air gaps.

An alternative embodiment is shown in FIG. 6. The sensor core halves 24a and 24b can be held in position by a plate 68 that can be part of the stack retained by the rivets 56. This embodiment has a plate 68 on each side of the sensor core halves 24a and 24b. Depending on the requirements of the application, a variety of plates and retaining structures could be devised by one having ordinary skill in the art. Alternatively, the number of air gaps does not have to be limited to only two. It can be envisioned a sensor core with a plurality of air gaps (see FIG. 11). The plate 68 could allow for a core that could have any number of gaps.

Figure 7:
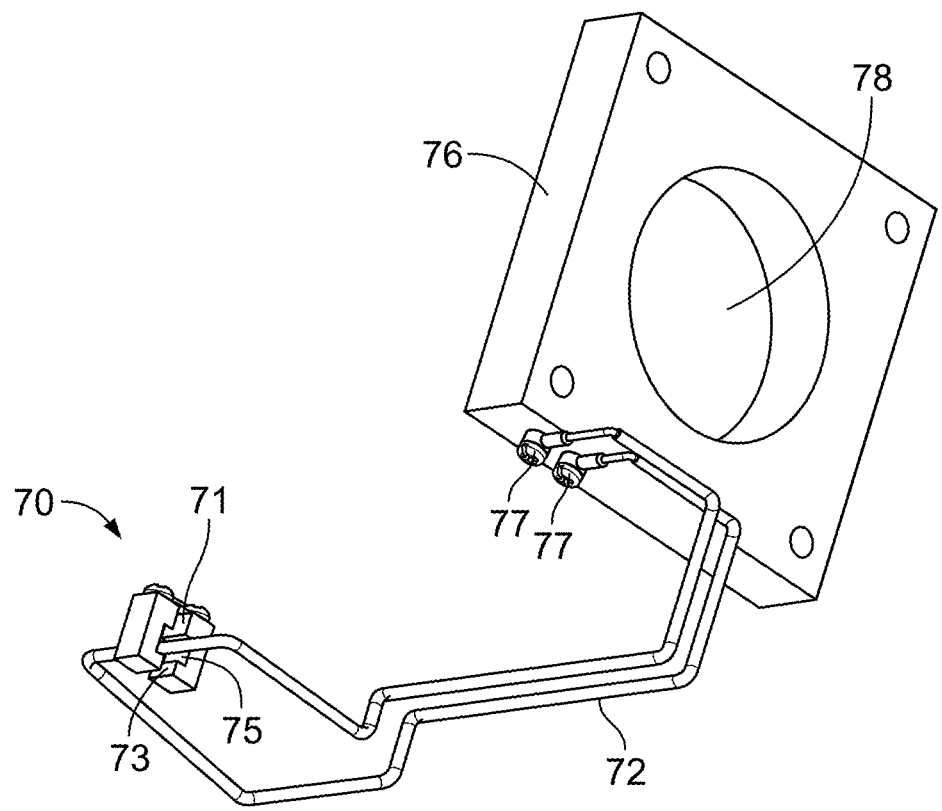
FIG. 7 is a perspective view of an alternative embodiment of a hall effect current sensor with multiple air gaps.

One of the limitations of any hall effect device can be the size of the conductor that can pass through the central opening. Another limitation is the maximum current a sensor can measure for a given size core. FIG. 7 demonstrates an alternative embodiment to utilize a hall effect sensor with multiple air gaps. Hall effect sensor 70 includes a primary air gap 71 and a secondary air gap 73. A conductor 72 passes through a central opening 75 of the sensor 70. The conductor 72 connects to a large core 76 at terminals 77. A large opening 78 in the large core 76 allows for a conductor (not shown) to pass through enabling the sensor 70 to measure a current. This embodiment allows the conductor to potentially be significantly larger than the central opening in the hall effect current sensor 70. The current sensor 70 could be mounted in a device (not shown) at any location and still be used to measure the current of a large conductor. A hall effect current sensor with multiple air gaps could be advantageous for this type of application because the size of the sensor core could be minimized while still maintaining a large current range to be sensed. The size and shape of the large core 76 and the conductor 72 could be imagined in many different useful configurations by one having ordinary skill in the art. The current sensor 70 with multiple air gaps can be used to measure a larger current than a comparably sized single air gap sensor.

Figure 8:
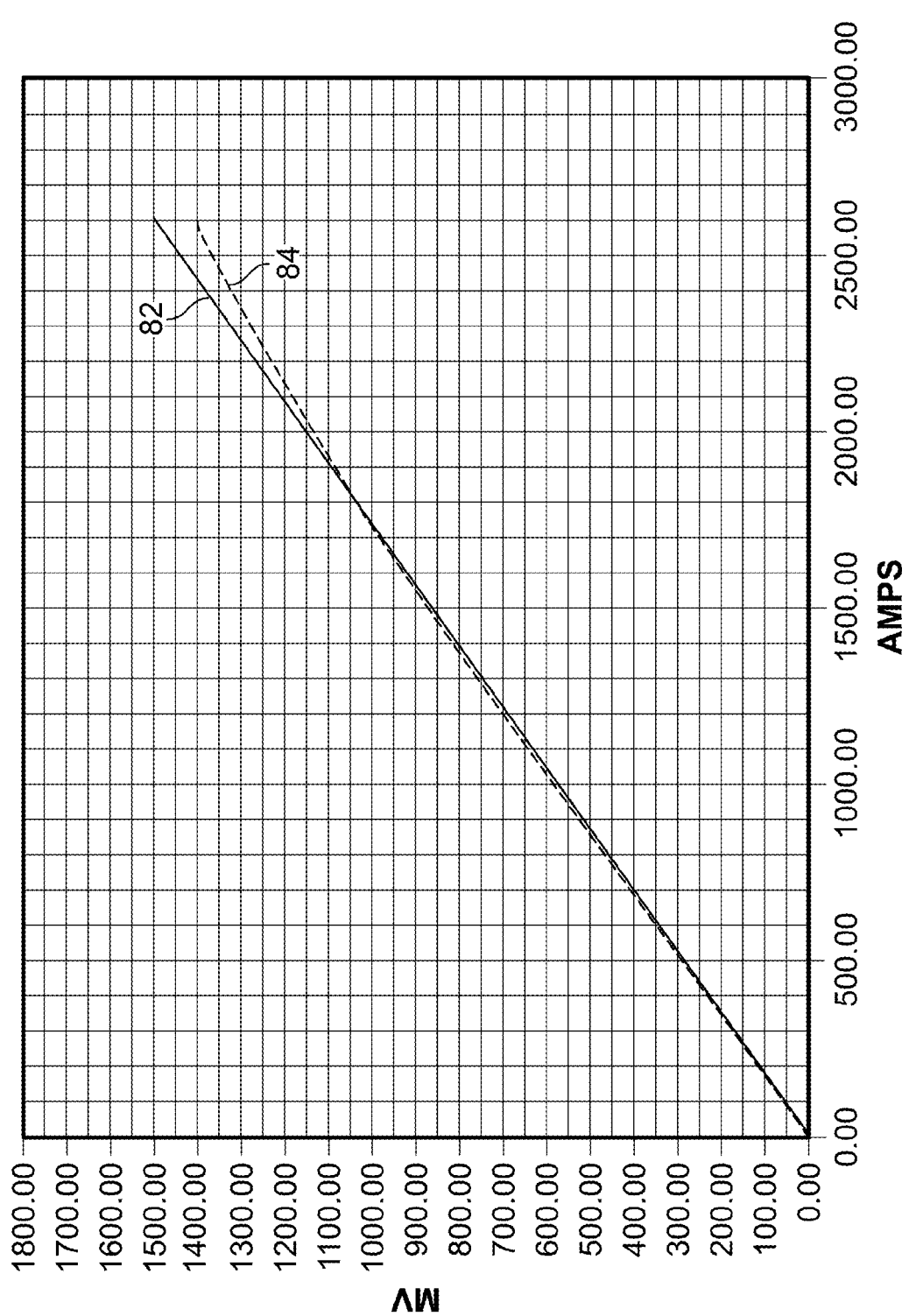
FIG. 8 is a graph showing the performance of a hall effect current sensor with a single air gap.
Figure 10:
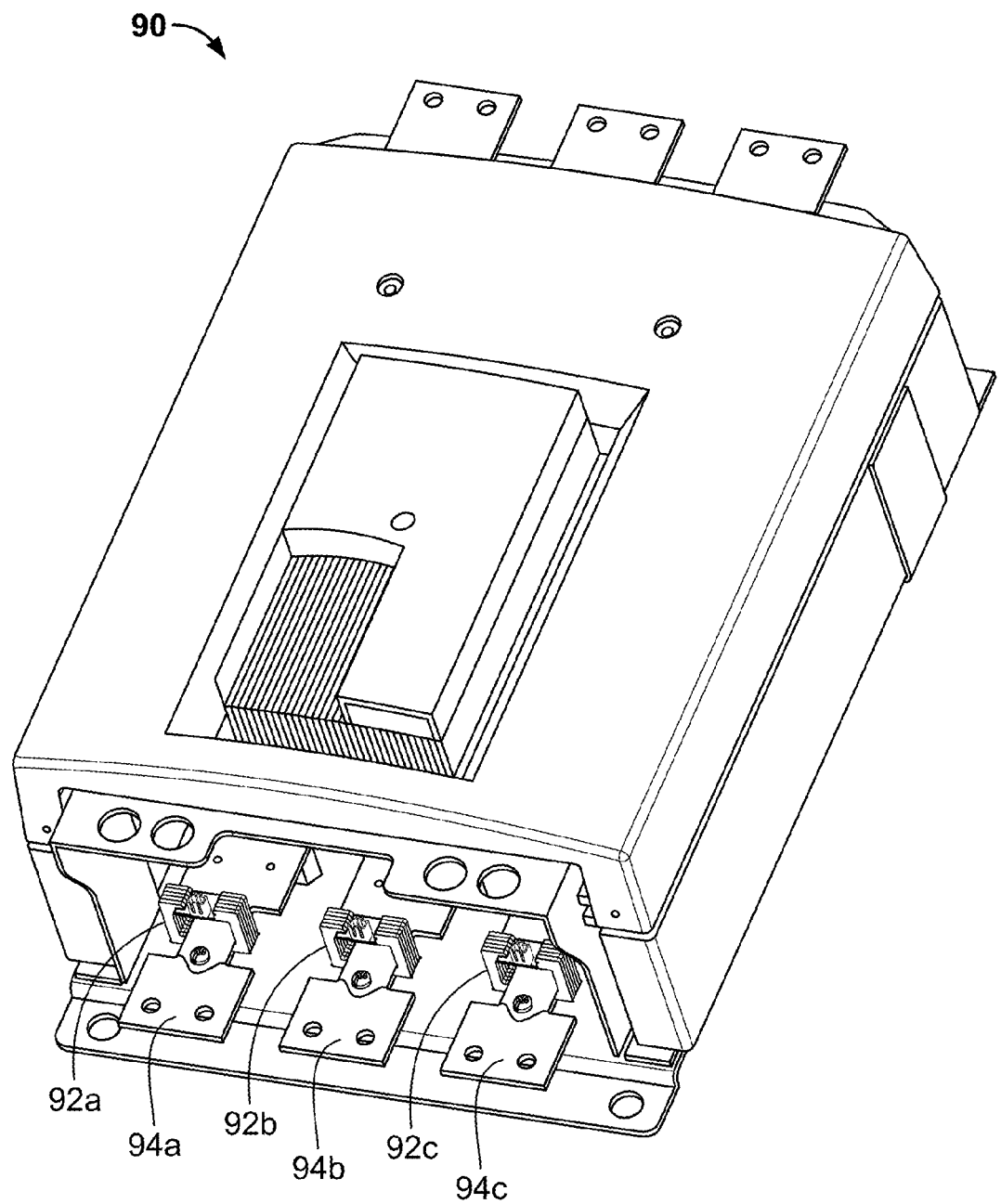
FIG. 10 is a perspective view of a smart motor controller employing three hall effect current sensors with multiple air gaps, according to embodiments of the invention.

One exemplary device utilizing a hall effect current sensor with multiple air gaps could be a smart motor controller (see FIG. 10). FIG. 8 shows a graph of the measured output from a hall effect current sensor with only a single air gap in a smart motor controller. A line 82 on the graph represents the ideal relationship for the output from the current sensor in millivolts and the actual current through a conductor in amps. The line 84 represents the data collected from the hall effect current sensor with a single air gap over a large range of currents passing through the conductor in the smart motor controller. The line 84 begins to curve away from the line 82 at about 1900 amps. This demonstrates that a sensor with a single air gap can have a limited range for sensing the current passing through a conductor.

Figure 9:
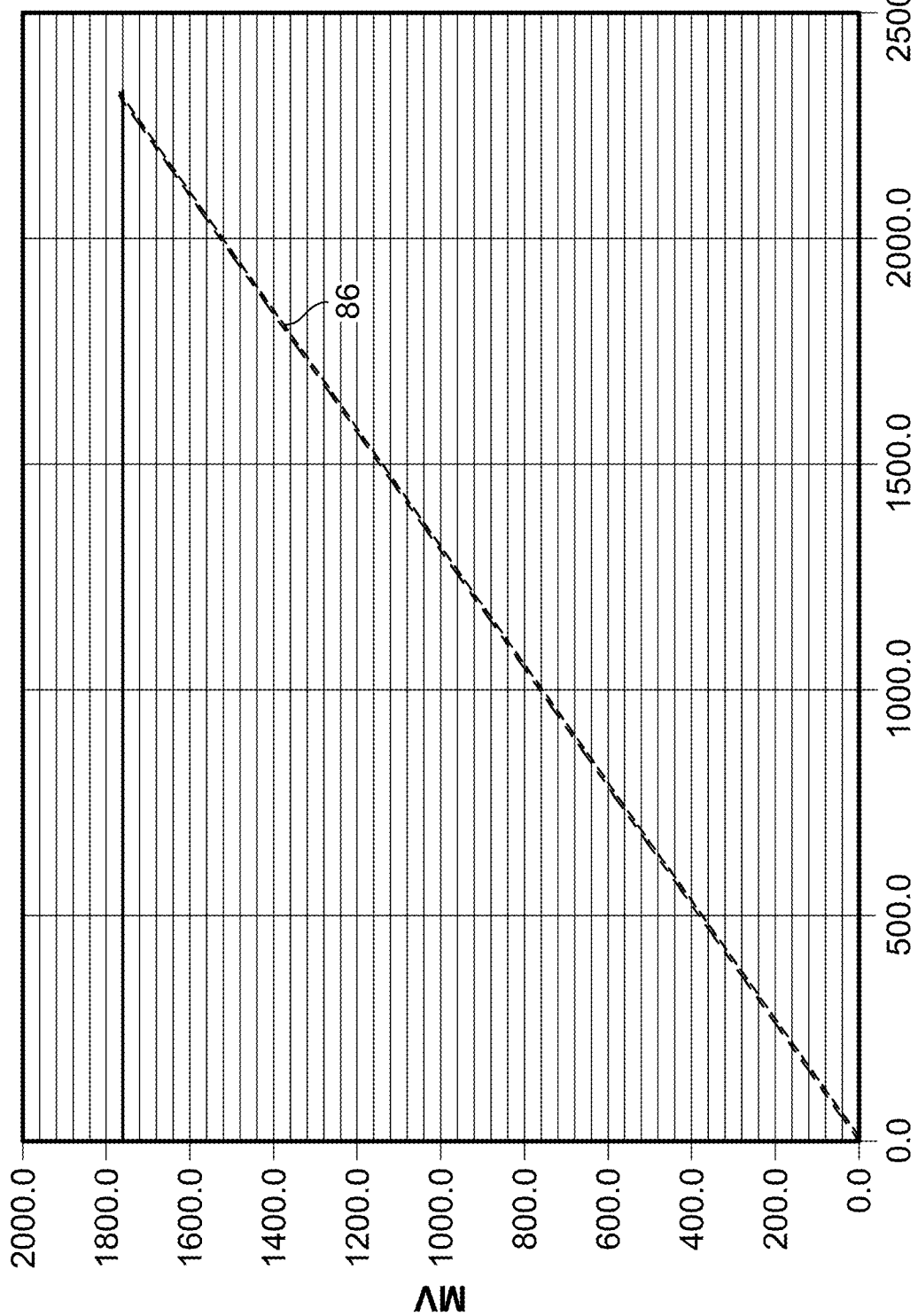
FIG. 9 is a graph showing the improved performance of a hall effect current sensor with multiple air gaps.

In contrast, FIG. 9 shows a graph from a smart motor controller with a hall effect current sensor with multiple air gaps. The models of smart motor controllers used were the same in both FIGS. 8 & 9. The only difference between the sensors used was the core. Line 86 is the measured output from the hall effect current sensor with multiple air gaps in the smart motor controller. The graph shows line 86 is linear out to over 2300 amps. The advantage of the multiple air gaps can be the increased range of current that can be sensed accurately. There can be no need to add expensive components like step-down transformers or increase the size of the core to achieve the same improved performance. Comparing FIGS. 8 & 9 shows the advantage of a hall effect current sensor with multiple air gaps in a smart motor controller.

Now turning to FIG. 10, in this embodiment a smart motor controller 90 can be depicted utilizing three hall effect current sensors 92a, 92b, and 92c mounted on conductors 94a, 94b, and 94c. It can be imagined that any number of combinations and applications can be envisioned by someone having ordinary skill in the art.

Figure 11:
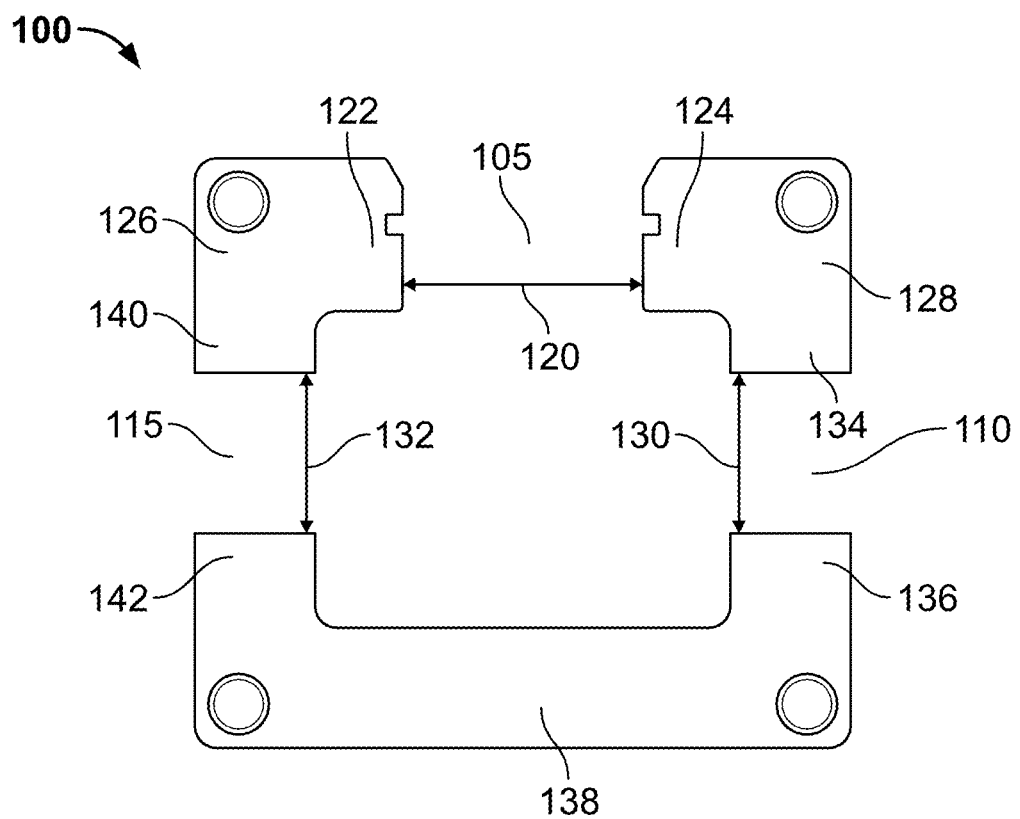
FIG. 11 is a front view of a hall effect current sensor core with a plurality of air gaps according to another embodiment of the invention.

FIG. 11 shows another alternative embodiment for a hall effect current sensor core with multiple air gaps. A core assembly 100 can include a primary air gap 105 and two secondary air gaps 110 and 115. The primary air gap 105 can be defined by a primary length 120 between distal ends 122 and 124 of core sections 126 and 128. The secondary air gaps 110 and 115 can be defined by a first length 130 and a second length 132. The first length 130 can be defined by the distance between the distal ends 134 and 136 of core sections 128 and 138. The second length 132 can be defined by the distance between distal ends 140 and 142 of core sections 126 and 138. The primary air gap length 120 may be greater than the lengths of secondary air gap lengths 130 and 132. Alternatively, the primary length 120 may be equal to or less than the air gap lengths 130 and 132. The lengths of the air gaps may all be equal or may all be different. One have ordinary skill in the art can envision my different combinations to determine different current ranges for a core size.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Finally, it is expressly contemplated that any of the processes or steps described herein may be combined, eliminated, or reordered. Accordingly, this description is meant to be taken only by way of example, and not to otherwise limit the scope of this invention.

We claim:

1. A hall effect current sensor comprising:
a mounting bracket;
a sensor assembly including a flux sensor; and
a sensor core including a first portion and a second portion, the first portion and the second portion defining a first air gap and a second air gap between the first portion and the second portion, wherein the first air gap is adapted to receive the sensor assembly, wherein the mounting bracket is a non-magnetic material and the second air gap is at least partially filled by the mounting bracket, and wherein the mounting bracket includes two apertures configured to receive a first leg of the first portion and a second leg of the second portion.

2. The sensor according to claim 1, wherein the second air gap can be substantially empty.

3. The sensor according to claim 1, wherein the length of the first air gap is greater that the length of the second air gap.

4. The sensor according to claim 1, wherein the length of the first air gap is equal to or less than the length of the second air gap.

5. The sensor according to claim 1, wherein the second air gap is substantially free of magnetic material.

6. The sensor according to claim 1, wherein the first portion includes a first spine, a first arm, and the first leg, and wherein the second portion includes a second spine, a second arm, and the second leg, wherein the first air gap is defined by a first distance between the first arm and the second arm, and wherein the second air gap is defined by a second distance between the first leg and the second leg.

7. The sensor according to claim 6, wherein the first distance is greater than the second distance.

8. The sensor according to claim 6, wherein the first distance is less than or equal to the second distance.

9. The sensor according to claim 6, wherein flux lines cross both the first air gap and the second air gap.

10. The sensor according to claim 6, wherein the sensor assembly is positioned within the first air gap.

11. The sensor according to claim 1, wherein the sensor core includes a plurality of air gaps, such that the sensor core is configured to pass flux lines across each of the plurality of air gaps.

12. The sensor according to claim 11, wherein the plurality of air gaps are the same length.

13. The sensor according to claim 11, wherein the plurality of air gaps includes a primary air gap and a plurality of secondary air gaps.

14. The sensor according to claim 13 wherein the primary air gap length is greater that the plurality of secondary air gaps length.

15. The sensor according to claim 13, wherein the primary air gap length is less than or equal to the plurality of secondary air gaps length.

16. The sensor according to claim 13, wherein the plurality of secondary air gaps have different lengths.

17. The sensor according to claim 13, wherein the sensor assembly is positioned within the primary air gap.

* * * * *